(12) United States Patent
Goto et al.

(10) Patent No.: US 7,939,988 B2
(45) Date of Patent: May 10, 2011

(54) ACOUSTIC WAVE DEVICE

(75) Inventors: Rei Goto, Osaka (JP); Hidekazu Nakanishi, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 86 days.

(21) Appl. No.: 12/428,577

(22) Filed: Apr. 23, 2009

(65) Prior Publication Data
US 2009/0267447 A1 Oct. 29, 2009

(30) Foreign Application Priority Data

Apr. 24, 2008 (JP) ................ 2008-113565
Apr. 24, 2008 (JP) ................ 2008-113566

(51) Int. Cl.
*H01L 41/08* (2006.01)
(52) U.S. Cl. .................................. 310/313 A
(58) Field of Classification Search ........... 310/313 A, 310/313 B, 313 R, 311, 328, 360, 364, 365, 310/366; 333/193, 196, 195; *H01L 41/08*
See application file for complete search history.

(56) References Cited

U.S. PATENT DOCUMENTS

| | | | | |
|---|---|---|---|---|
| 6,037,847 A | * | 3/2000 | Ueda et al. | 310/313 A |
| 7,327,071 B2 | * | 2/2008 | Nishiyama et al. | 310/313 A |
| 7,339,304 B2 | * | 3/2008 | Kadota et al. | 310/313 A |

FOREIGN PATENT DOCUMENTS

JP 2003-209458 7/2003

* cited by examiner

*Primary Examiner* — Walter Benson
*Assistant Examiner* — Karen Addison
(74) *Attorney, Agent, or Firm* — Wenderoth, Lind & Ponack, L.L.P.

(57) ABSTRACT

An acoustic wave device includes a piezoelectric substrate having a surface adapted to allow a leaky surface wave to propagate thereon, an interdigital electrode provided on a portion of the surface of the piezoelectric substrate, and a dielectric layer provided on the surface of the piezoelectric substrate to cover the interdigital electrode. The piezoelectric substrate is made of lithium niobate. The dielectric layer is made of tantalum pentoxide. The piezoelectric substrate is made of a rotated Y-cut substrate having a cut angle which is not smaller than 2.5 degrees and is not larger than 22.5 degrees. A ratio $H/\lambda$ of a film thickness H of the dielectric layer to a wavelength $\lambda$ of a center frequency of the leaky surface wave ranges from 0.034 to 0.126. This acoustic wave device works in a wide band width.

11 Claims, 9 Drawing Sheets

ACOUSTIC WAVE DEVICE

FIELD OF THE INVENTION

The present invention relates to an acoustic wave device used for telecommunication devices, such as mobile phones.

BACKGROUND OF THE INVENTION

FIG. 12 is a sectional view of conventional acoustic wave device 501 disclosed in Japanese Patent Laid-Open Publication, No. 2003-209458. Acoustic wave device 501 includes piezoelectric substrate 1 made of lithium niobate, interdigital electrode 2 provided on piezoelectric substrate 1, and dielectric layer 3 made of $SiO_2$ covering interdigital electrode 2.

In conventional acoustic wave device 501, a phase velocity of acoustic wave propagating on a surface of piezoelectric substrate 1 is smaller than a phase velocity of slow transverse waves propagating in piezoelectric substrate 1 in order to suppress leakage of the acoustic wave propagating along the interfacial boundary between dielectric layer 3 and piezoelectric substrate 1. It thus becomes necessary for this reason to increase substantially a film thickness of dielectric layer 3. On the other hand, however, an electromechanical coupling coefficient of leaky surface waves decreases as the film thickness increases, and consequently, makes it difficult to broaden the bandwidth.

In addition, the conventional acoustic wave device 501 produces Rayleigh waves due to a low electromechanical coupling coefficient, which causes spurious.

SUMMARY OF THE INVENTION

An acoustic wave device includes a piezoelectric substrate having a surface adapted to allow leaky surface wave to propagate thereon, an interdigital electrode provided on a portion of the surface of the piezoelectric substrate, and a dielectric layer provided on the surface of the piezoelectric substrate to cover the interdigital electrode. The piezoelectric substrate is made of lithium niobate. The dielectric layer is made of tantalum pentoxide. The piezoelectric substrate is made of a rotated Y-cut substrate having a cut angle which is not smaller than 2.5 degrees and is not larger than 22.5 degrees. A ratio H/λ of a film thickness H of the dielectric layer to a wavelength λ of a center frequency of the leaky surface wave ranges from 0.034 to 0.126.

This acoustic wave device works in a wide band width.

DETAILED DESCRIPTION OF PREFERRED EMBODIMENTS

Exemplary Embodiment 1

Figure 1A:
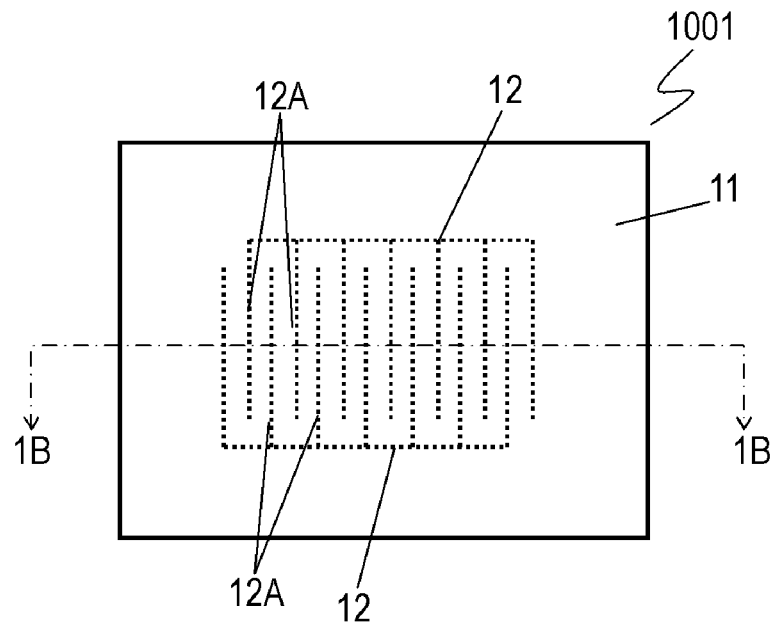
FIG. 1A is a top view of an acoustic wave device according to Exemplary Embodiment 1 of the present invention.
Figure 1B:
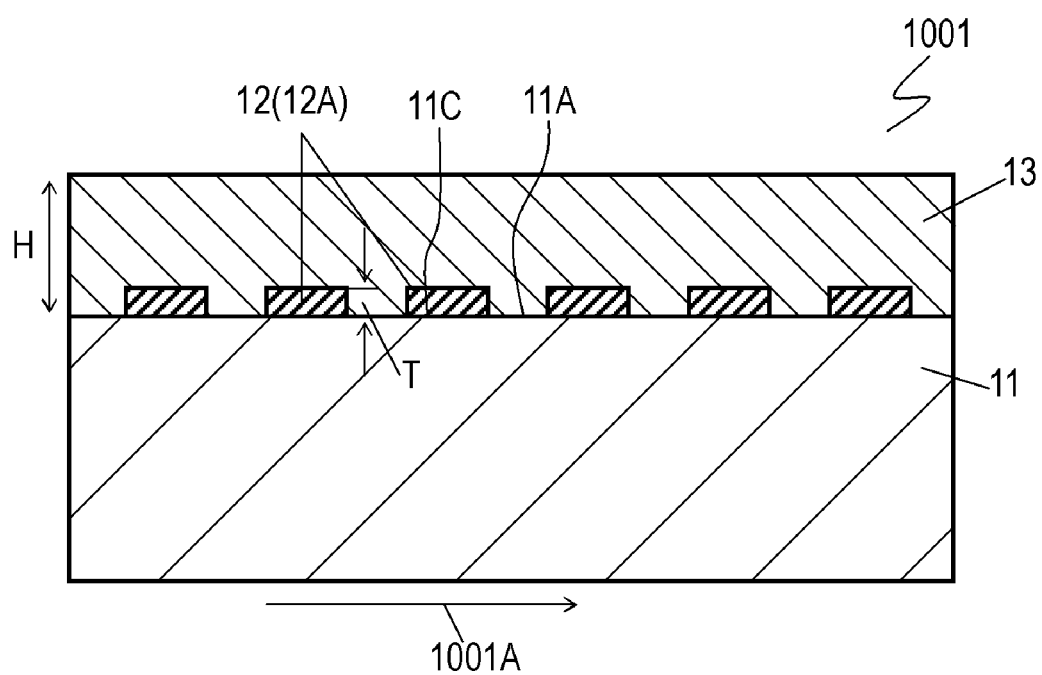
FIG. 1B is a sectional view of the acoustic wave device at line 1B-1B shown in FIG. 1A.

FIG. 1A is a top view of acoustic wave device 1001 according to Exemplary Embodiment 1 of the present invention. FIG. 1B is a sectional view of acoustic wave device 1001 at line 1B-1B shown in FIG. 1A. Acoustic wave device 1001 includes piezoelectric substrate 11 made of lithium niobate ($LiNbO_3$), interdigital electrode 12 provided on portion 11C of surface 11A of piezoelectric substrate 11, and dielectric layer 13 provided on surface 11A of piezoelectric substrate 11 covering interdigital electrode 12. Dielectric layer 13 is made of tantalum pentoxide ($Ta_2O_5$). Piezoelectric substrate 11 employs a rotated Y-cut substrate having a cut angle which is not smaller than 2.5 degrees and is smaller than 22.5 degrees.

Figure 1C:
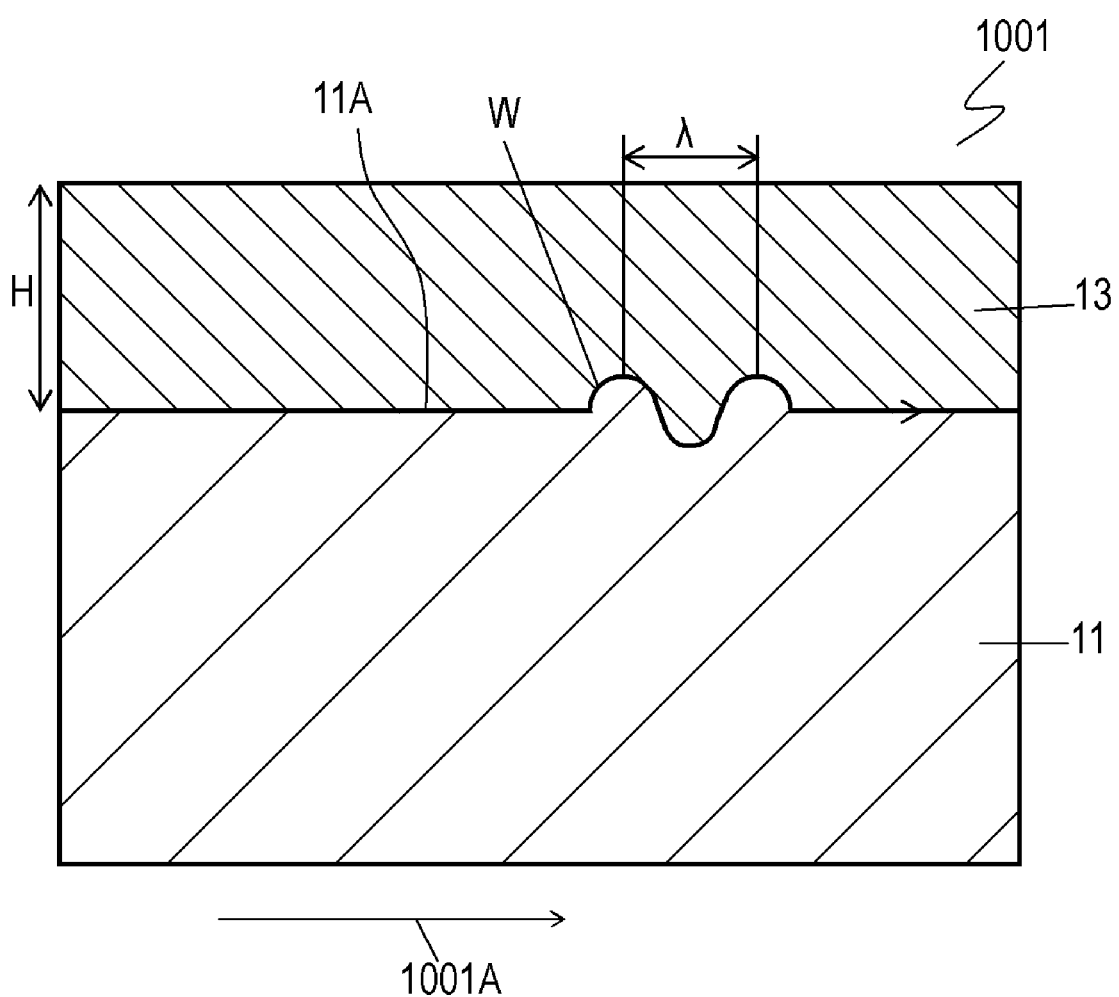
FIG. 1C is a sectional view of the acoustic wave device according to Embodiment 1 for illustrating an acoustic wave propagating in the acoustic wave device.

FIG. 1C is a sectional view of the acoustic wave device for illustrating leaky surface wave W propagating in a direction 1001A along surface 11A of piezoelectric substrate 11. Piezoelectric substrate 11 is adapted to allow leaky surface wave W to propagate on surface 11A. As shown in FIG. 1A, interdigital electrode 12 has plural electrode fingers 12A extending in a direction perpendicular to direction 1001A. Leaky surface wave W is a SH wave, which displace piezoelectric substrate 11 and dielectric layer 13 in a direction parallel with surface 11A. Dielectric layer 13 has film thickness H. The ratio of film thickness H to wavelength λ of a center frequency of the leaky surface wave on piezoelectric substrate 11 ranges from 0.034 to 0.126. Interdigital electrode 12 is made of aluminum having a comparatively small mass to be patterned accurately for high frequencies. This reduces frequency deviations due to variations in film thickness T in a direction perpendicular to surface 11A. The variations are produced during processes of electrodes 12.

Film thickness H of dielectric layer 13 will be described below. Samples of example 1 of acoustic wave device 1001 having the structure shown in FIGS. 1A and 1B according to Embodiment 1 were prepared. The samples of example 1 include piezoelectric substrates 11 of rotated Y-cut substrates having various cut angles of 5, 10, 15, 20 and 25 degrees, and interdigital electrodes 12 made of aluminum. Each electrode 12 had film thicknesses T shown in FIG. 1B and a ratio T/λ of film thickness T to wavelength λ was 0.08. Samples of a comparative example were prepared similarly to example 1. Each sample of the comparative example included a dielectric layers made of $SiO_2$ instead of the material of dielectric layer 13. Acoustic wave velocities of these samples were calculated by the method by Campbell, et al. using the Smith's constant as a material constant of $LiNbO_3$.

Figure 2:
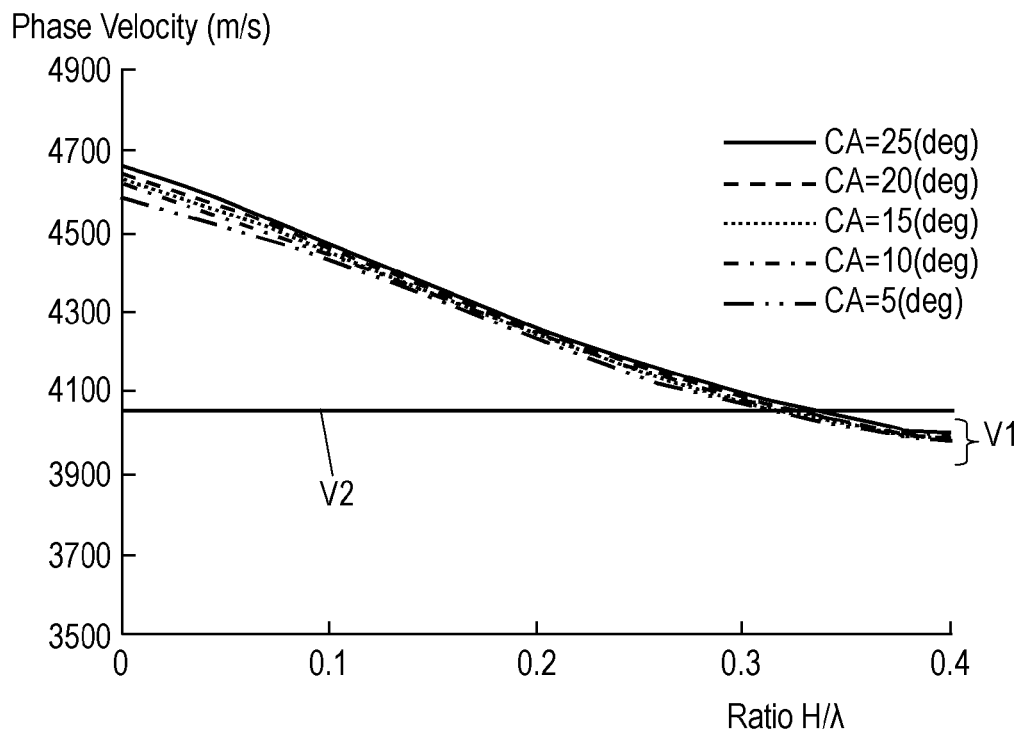
FIG. 2 shows a relation between a film thickness of a dielectric layer and an acoustic wave velocity of comparative example of an acoustic wave device.

FIG. 2 shows a relation between the ratio H/λ of film thickness H of the dielectric layer in the direction perpendicular to the surface of the piezoelectric substrate to the wavelength λ, and phase velocity V1 of the SH wave in the comparative example of the acoustic wave device. FIG. 2 also shows phase velocity V2 of the slow transverse wave propagating on surface 11A of piezoelectric substrate 11 as calculated by using the Smith's constant. The velocity V2 was 4055 m/s. Leakage of the acoustic wave propagating on surface 11A of piezoelectric substrate 11 can be suppressed by making the velocity V1 of the SH wave slower than the velocity V2. As shown in FIG. 2, film thicknesses H are determined to satisfy the condition that velocity V1 becomes smaller than velocity V2 as described below. In the case that the rotated Y-cut substrate has cut angle CA of 5 degrees, a value of H/λ, i.e., the ratio of film thickness H of dielectric layer 13 to the wavelength λ is 0.328 or greater. That is, the minimum value Rmin1 of the ratio H/λ is 0.328. In the case that the cut angle CA is 10 degrees, the ratio H/λ is 0.335 or greater, that is, the minimum value Rmin1 of the ratio H/λ is 0.335. In the case that the cut angle CA is 15 degrees, the ratio H/λ is 0.338 or greater, that is, the minimum value Rmin1 of the ratio H/λ is 0.338. In the case that the cut angle CA is 20 degrees, the ratio H/λ is 0.341 or greater, that is, the minimum value Rmin1 of the ratio H/λ is 0.341. In the case that the cut angle CA is 25 degrees, the ratio H/λ is 0.344λ or greater, that is, the minimum value Rmin1 of the ratio H/λ is 0.344.

Figure 3:
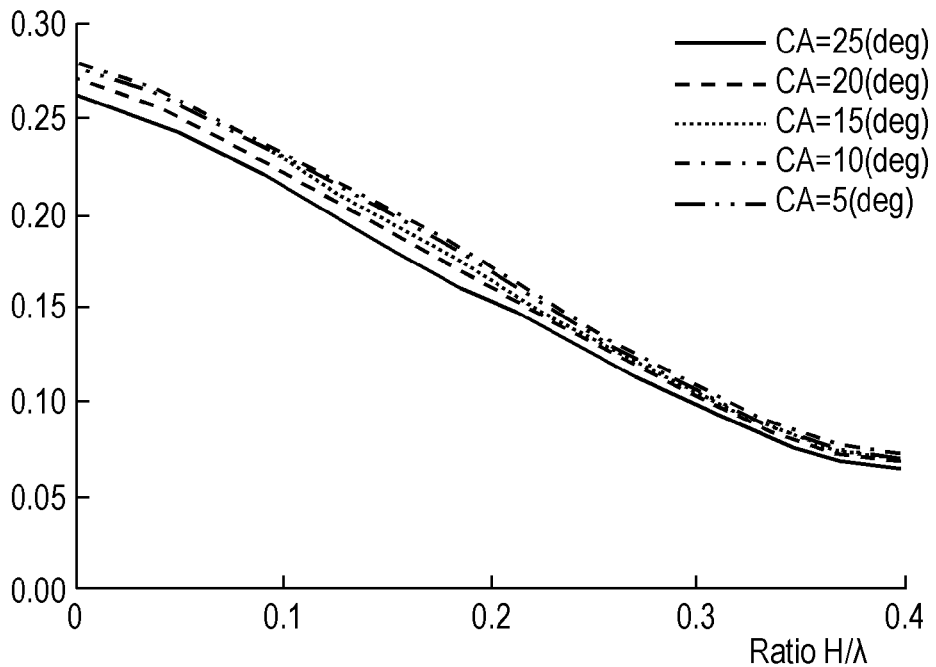
FIG. 3 shows a relation between the film thickness of the dielectric layer and an electromechanical coupling coefficient of the comparative example.
Figure 4:
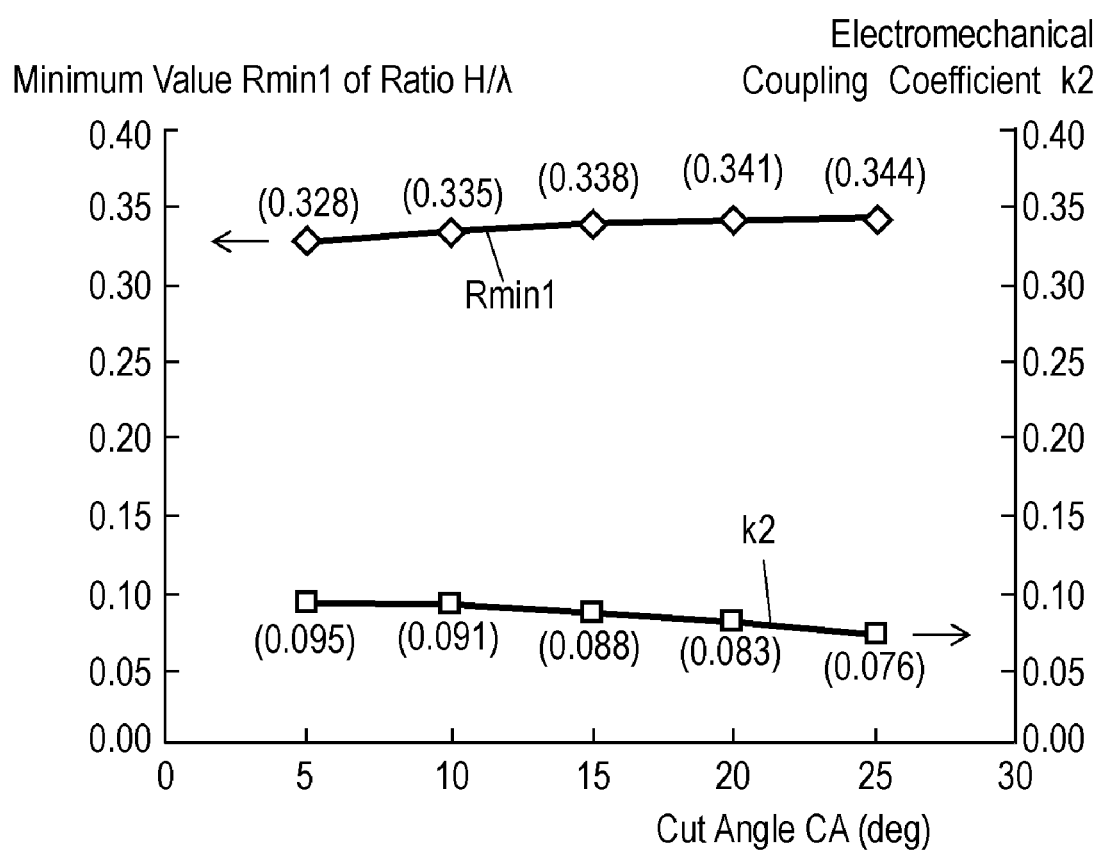
FIG. 4 shows a relation between the film thickness of the dielectric layer and the electromechanical coupling coefficient of the comparative example of the acoustic wave device.

FIG. 3 shows a relation between ratio H/λ and electromechanical coupling coefficient k2 of samples the comparative example. FIG. 3 provides a relation between cut angle CA and electromechanical coupling coefficient k2 when ratio H/λ takes minimum value Rmin1. FIG. 4 shows relations among cut angle CA, minimum value Rmin1 of ratio H/λ, and electromechanical coupling coefficient k2. As shown in FIG. 4, the electromechanical coupling coefficient k2 is 0.095 when the cut angle CA is 5 degrees and the ratio H/λ is 0.328λ. The electromechanical coupling coefficient k2 is 0.091 when the cut angle CA is 10 degrees and the ratio H/A is 0.335. The electromechanical coupling coefficient k2 is 0.088 when the cut angle CA is 15 degrees and the ratio H/λ is 0.338. The electromechanical coupling coefficient k2 is 0.083 when the cut angle CA is 20 degrees and the ratio H/λ is 0.341. The electromechanical coupling coefficient k2 is 0.076 when the cut angle CA is 25 degrees and the ratio H/A is 0.344.

A relation between the minimum value of film thickness H for suppressing leakage of the acoustic wave and the electromechanical coupling coefficient k2 corresponding to the value is derived on the samples of acoustic wave device 1001 including dielectric layers 13 made of $Ta_2O_5$ according to Embodiment 1.

Figure 5:
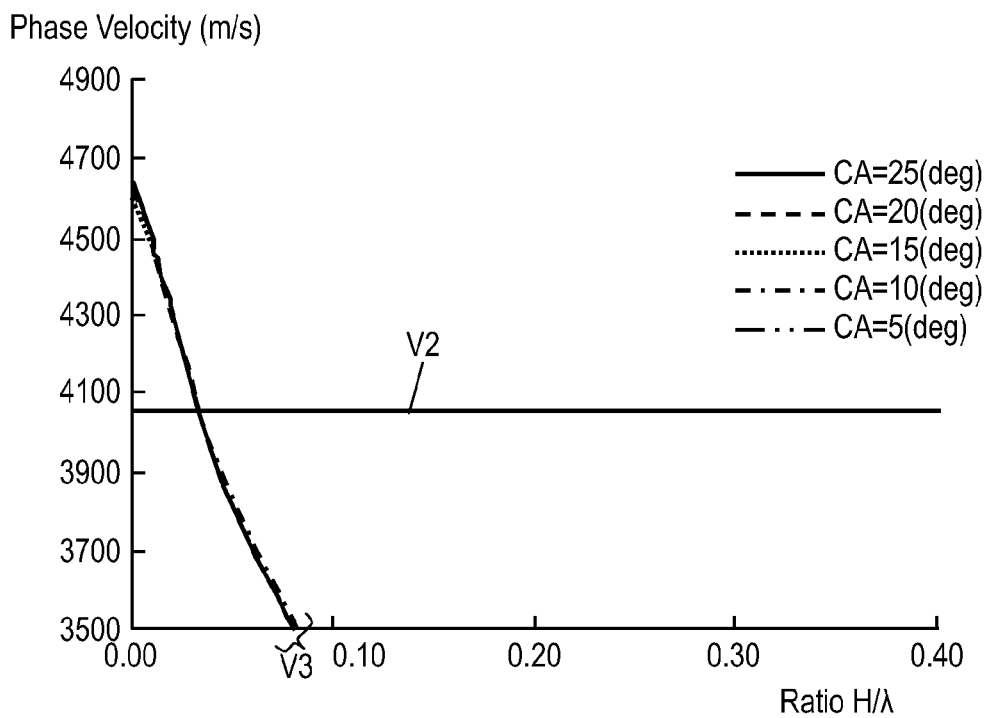
FIG. 5 shows a relation between a film thickness of a dielectric layer and an acoustic wave velocity of the acoustic wave device according to Embodiment 1.

FIG. 5 shows a relation between the ratio H/λ of film thickness H of dielectric layer 13 in the direction perpendicular to surface 11A of piezoelectric substrate 11 to the wavelength λ and phase velocity V3 of the SH wave on the samples of acoustic wave device 1001 according to Embodiment 1. FIG. 5 also shows phase velocity V2 of a slow transverse wave propagating on surface 11A of piezoelectric substrate 11 as calculated by using the Smith's constant. The phase velocity V2 is 4055 m/s. The phase velocity V3 of the SH wave is smaller than the phase velocity V2 to suppress leakage of the acoustic wave propagating on surface 11A of piezoelectric substrate 11. As shown in FIG. 5, film thicknesses H that satisfy the condition that phase velocity V3 is smaller than velocity V2 are determined below. In the case that the rotated Y-cut substrate has cut angle CA of 5 degrees, the ratio H/λ of film thickness H of dielectric layer 13 to the wavelength λ is 0.034 or greater. That is, the minimum value Rmin2 of the ratio H/λ is 0.034. In the case that the cut angle CA is 10 degrees, the ratio H/λ is 0.0344 or greater, that is, the minimum value Rmin2 of the ratio H/λ is 0.0344. In the case that the cut angle CA is 15 degrees, the ratio H/A is 0.0345, that is, the minimum value Rmin2 of the ratio H/λ is 0.0345. In the case that the cut angle CA is 20 degrees, the ratio H/λ is 0.0346 or greater, that is, the minimum value Rmin2 of the ratio H/λ is 0.0346. In the case that the cut angle CA is 25 degrees, the ratio H/λ is 0.0347 or greater, that is, the minimum value Rmin2 of the ratio H/λ is 0.0347.

Figure 6:
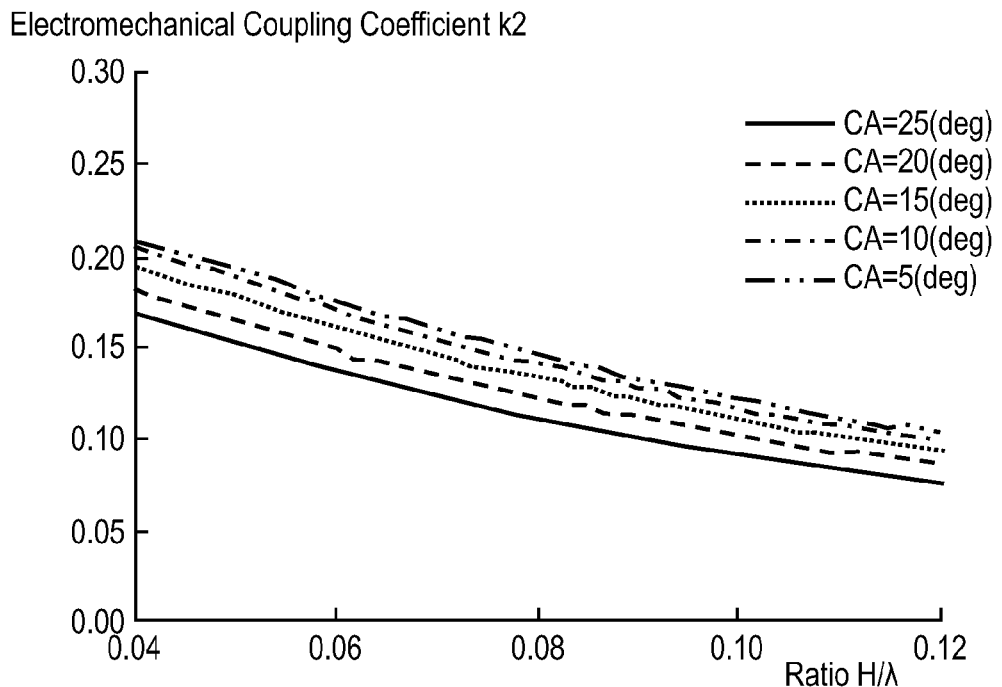
FIG. 6 shows a relation between the film thickness of the dielectric layer and an electromechanical coupling coefficient of the acoustic wave device according to Embodiment 1.
Figure 7:
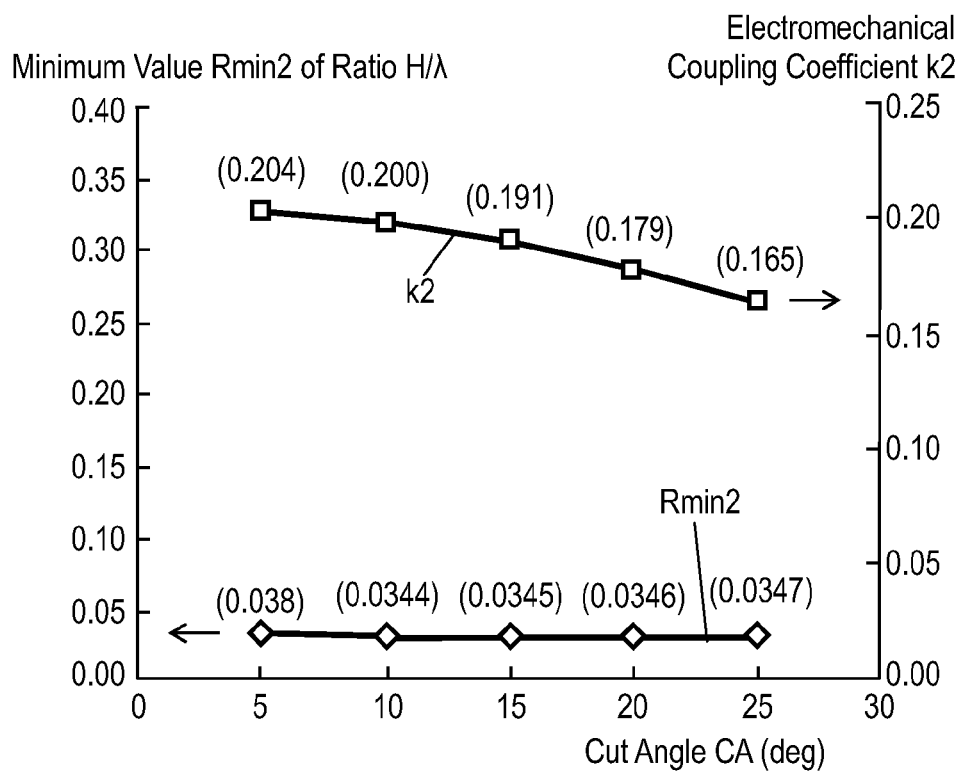
FIG. 7 shows a relation between the film thickness of the dielectric layer and the electromechanical coupling coefficient of the acoustic wave device according to Embodiment 1.

FIG. 6 shows a relation between ratio H/λ and electromechanical coupling coefficient k2 of the samples of example 1. FIG. 6 provides a relation between cut angle CA and electromechanical coupling coefficient k2 of example 1 of acoustic wave device 1001 when ratio H/λ is minimum value Rmin2. FIG. 7 shows relations among cut angle CA, minimum value Rmin2 of ratio H/λ, and electromechanical coupling coefficient k2 of example 1 of acoustic wave device 1001. As shown in FIG. 7, electromechanical coupling coefficient k2 is 0.204 when the cut angle CA is 5 degrees and the ratio H/λ is 0.038. The electromechanical coupling coefficient k2 is 0.200 when the cut angle is 10 degrees and the ratio H/λ is 0.0344. The electromechanical coupling coefficient k2 is 0.191 when the cut angle is 15 degrees and the ratio H/λ is 0.0345. The electromechanical coupling coefficient k2 is 0.179 when the cut angle is 20 degrees and the ratio H/λ is 0.0346. The electromechanical coupling coefficient k2 is 0.165 when the cut angle is 25 degrees and the ratio H/λ is 0.0347.

Figure 8:
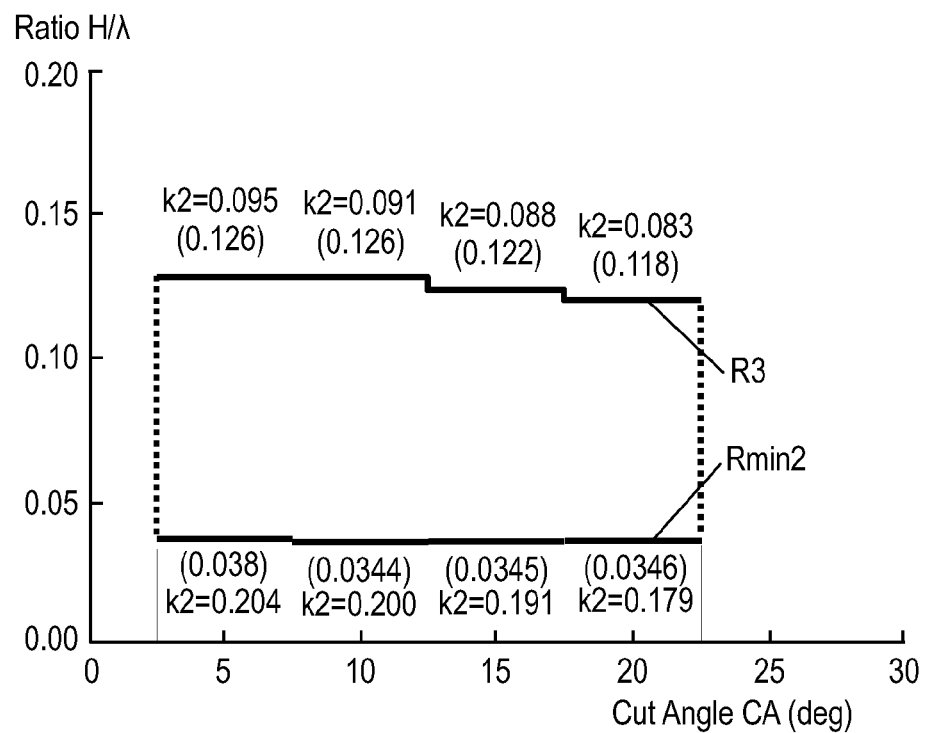
FIG. 8 shows a relation between the film thickness of the dielectric layer and the electromechanical coupling coefficient of the acoustic wave device according to Embodiment 1.

FIG. 8 shows the minimum values Rmin2 of ratio H/λ corresponding to cut angles CA of the rotated Y-cut substrate used as piezoelectric substrates 11 of the samples of example 1 of acoustic wave device 1001.

FIG. 4 shows values of electromechanical coupling coefficient k2 corresponding to the minimum values Rmin1 of ratio H/λ, the ratio of film thickness H of the dielectric layer to the wavelength λ to avoid leakage of the acoustic wave for the comparative example of the acoustic wave device including the dielectric layer made of $SiO_2$. FIG. 6 provides values of film thickness H (ratio H/A) to obtain these values of electromechanical coupling coefficient k2 on example 1 of acoustic wave devices 1001 including dielectric layers 13 made of $Ta_2O_5$. FIG. 8 also shows values R3 of ratio H/λ for example 1 of acoustic wave device 1001 to obtain electromechanical coupling coefficients k2 corresponding to the minimum values Rmin1 of ratio H/λ of the comparative example. As shown in FIG. 8, the value of ratio H/λ of film thickness H of dielectric layer 13 to the wavelength λ is 0.126 when the electromechanical coupling coefficient k2 is 0.095. The value of ratio H/λ is 0.126 when the electromechanical coupling coefficient k2 is 0.091. The value of ratio H/λ is 0.122 when the electromechanical coupling coefficient k2 is 0.088. The value of ratio H/λ is 0.118 when the electromechanical coupling coefficient k2 is 0.083. The value of ratio H/λ is 0.114 when the electromechanical coupling coefficient k2 is 0.076.

As shown in FIG. 8, the minimum values Rmin2 and the values R3 of the ratio H/λ substantially constitute a base side and an upper side of a quadrilateral shape, respectively. The ratio H/λ of film thickness H of dielectric layer 13 to the wavelength λ of example 1 of acoustic wave device 1001 is determined to be a value within this quadrilateral. This arrangement causes electromechanical coupling coefficient k2 to be higher than that of the comparative example of the acoustic wave device including the dielectric layer made of SiO$_2$ while providing minimum film thickness H preventing leakage of the acoustic wave, thereby providing acoustic wave device 1001 with a wide bandwidth. In the case that piezoelectric substrate 11 is made of rotated Y-cut substrate having a cut angle CA which is not smaller than 2.5 degrees and is smaller than 7.5 degrees, ratio H/λ ranges from 0.038 to 0.126 in order to position the value of H/λ in the quadrilateral shown in FIG. 8. In the case that the cut angle CA is not smaller than 7.5 degrees and is smaller than 12.5 degrees, the ratio H/λ ranges from 0.0344 to 0.126. In the case that the cut angle CA is not smaller than 12.5 degrees and is smaller than 17.5 degrees, the ratio H/λ ranges from 0.0345 to 0.122. In the case that the cut angle CA is not smaller than 17.5 degrees and is smaller than 22.5 degrees, the ratio H/λ ranges from 0.0346 to 0.118.

Acoustic wave device 1001 according to Embodiment 1 has a high electromechanical coupling coefficient and a wideband characteristic, being useful for various telecommunication devices, such as mobile phones.

Exemplary Embodiment 2

An acoustic wave device according to Exemplary Embodiment 2 has the same structure as acoustic wave device 1001 according to Embodiment 1 shown in FIGS. 1A to 1C.

The acoustic wave device according to Embodiment 2 includes piezoelectric substrate 11 made of a rotated Y-cut substrate of LiNbO$_3$ having a cut angle which is not smaller than 0.25 and is smaller than 22.5 degrees. Dielectric layer 13 has ratio H/λ of film thickness H to wavelength λ of the center frequency of leaky surface wave W propagating on piezoelectric substrate 11. Ratio H/λ is not larger than 0.123.

Film thickness H of dielectric layer 13 will be described below. Samples of example 2 of the acoustic wave device according to Embodiment 2 having the structure shown in FIGS. 1A and 1B were prepared. The samples of example 2 included piezoelectric substrates 11 made of rotated Y-cut substrates having different cut angles of 0, 5, 10, 15, 20 and 25 degrees, interdigital electrodes 12 made of aluminum each having ratio T/λ of film thickness T shown in FIG. 1B to wavelength λ. Ratio T/λ was 0.08. Phase velocities of the acoustic wave of these samples were calculated by the method by Campbell using the Smith's constant as the material constant of LiNbO$_3$.

Figure 9:
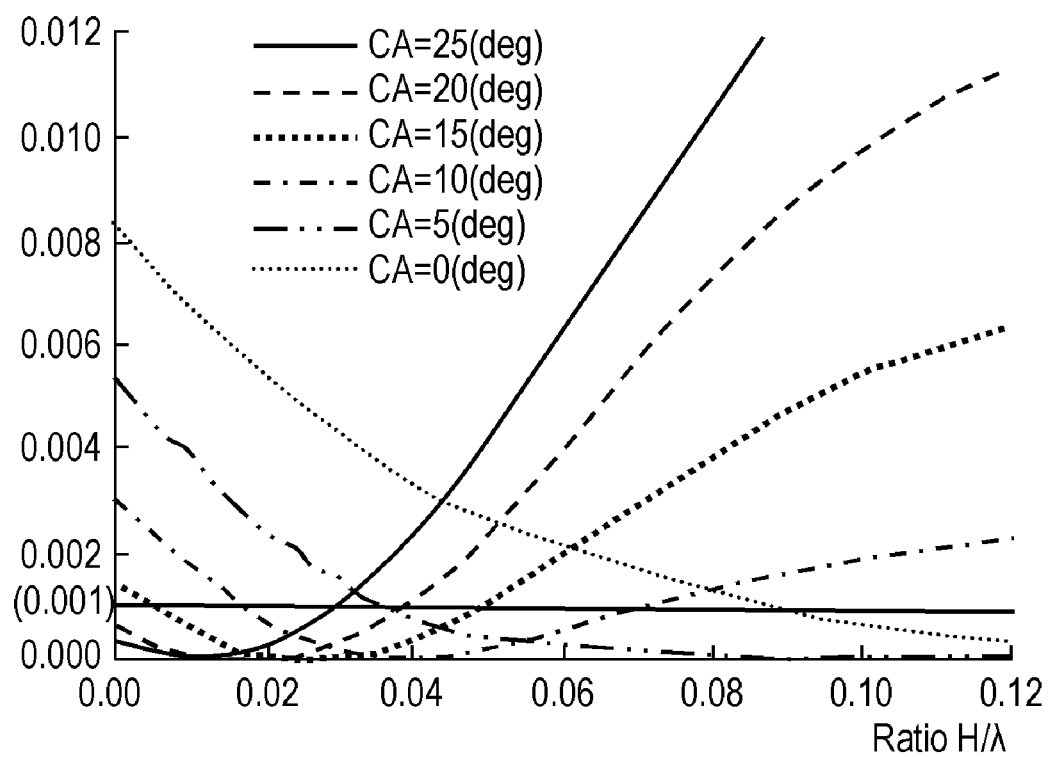
FIG. 9 shows a relation between an electromechanical coupling coefficient and a film thickness of a dielectric layer of an acoustic wave device according to Exemplary Embodiment 2.

FIG. 9 shows a relation between ratio H/λ of film thickness H of dielectric layer 13 to the wavelength λ and electromechanical coupling coefficient k2 of the samples including piezoelectric substrates 11 of the rotated Y-cut plates having cut angles CA of 0, 5, 10, 15, 20, and 25 degrees.

Figure 10:
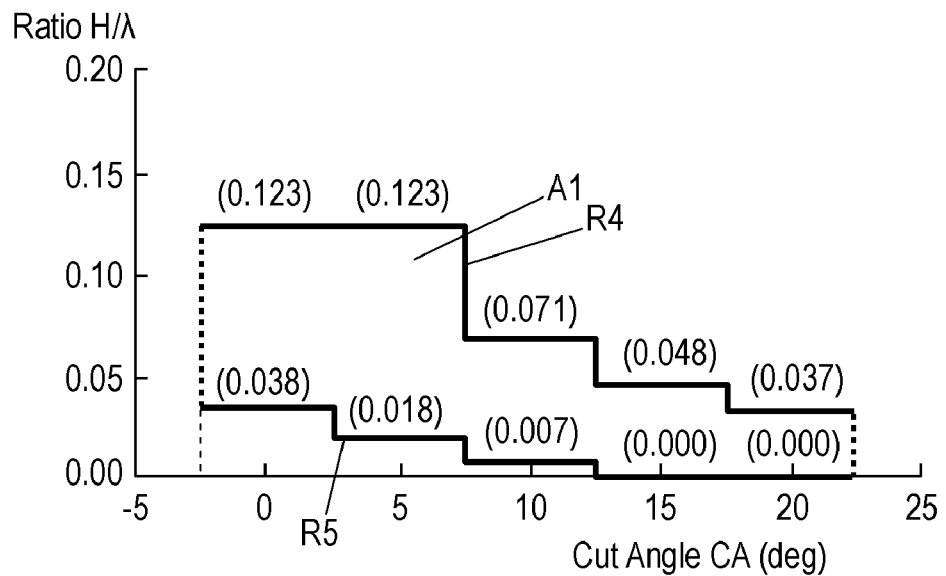
FIG. 10 shows the film thickness of the dielectric layer of the acoustic wave device according to Embodiment 2.

A value of electromechanical coupling coefficient k2 of a device using quartz crystal is 0.001. As shown in FIG. 9, in the case that the rotated Y-cut substrate has cut angle CA of 15 degrees, for instance, the ratio H/A ranges from 0.007 to 0.048 to provide the acoustic wave device according to Embodiment 2 with electromechanical coupling coefficient k2 smaller than the electromechanical coupling coefficient k2 of the device using quartz crystal. Similarly, FIG. 10 shows upper limits R4 and lower limits R5 of the ratio H/λ causing electromechanical coupling coefficient k2 to be smaller than that of the device with quartz crystal when the cut angles CA are 0, 5, 10, 15, 20, and 25 degrees. In other words, the ratio H/λ is positioned within area A1 surrounded by upper limits R4 and lower limits R5 so as to obtain the acoustic wave device according to the Embodiment 2 having electromechanical coupling coefficient k2 smaller than that of the device with quartz crystal.

FIG. 10 shows the minimum values Rmin2 of ratio H/λ corresponding to cut angles CA of the rotated Y-cut substrate used as piezoelectric substrates 11 of the samples of example 2 of the acoustic wave device. In the case that piezoelectric substrate 11 is made of a rotated Y-cut plate having cut angle CA is not smaller than −2.5 degree and is smaller than 2.5 degrees, ratio H/A of film thickness H of dielectric layer 13 to the wavelength λ ranges from 0.038 to 0.123, as shown in FIG. 10. In the case that the cut angle CA is not smaller than 2.5 degrees and is smaller than 7.5 degrees, the ratio H/A ranges from 0.018 to 0.123. In the case that the cut angle CA is not smaller than 7.5 degrees and is smaller than 12.5 degrees, the ratio H/λ ranges from 0.007 to 0.071. In the case that the cut angle CA is not smaller than 12.5 degrees and is smaller than 17.5 degrees, the ratio H/λ is larger than 0 and is not larger than 0.048, or the ratio H/λ is larger than ratio T/λ of film thickness T of electrode 12 to the wavelength λ and is not larger than 0.048. In the case that the cut angle CA is not smaller than 17.5 degrees and is smaller than 22.5 degrees, the ratio H/λ is larger than 0 and is not larger than 0.037, or the ratio H/λ is larger than ratio T/λ of film thickness T of electrode 12 to the wavelength λ and is not larger than 0.037.

The acoustic wave device according to Embodiment 2 has the electromechanical coupling coefficient k2 for the Rayleigh wave smaller than the electromechanical coupling coefficient k2 for the device with quartz crystal, hence suppressing Rayleigh wave. The device accordingly suppresses spurious, and therefore is, useful for various telecommunication devices, such as mobile phones.

Figure 11:
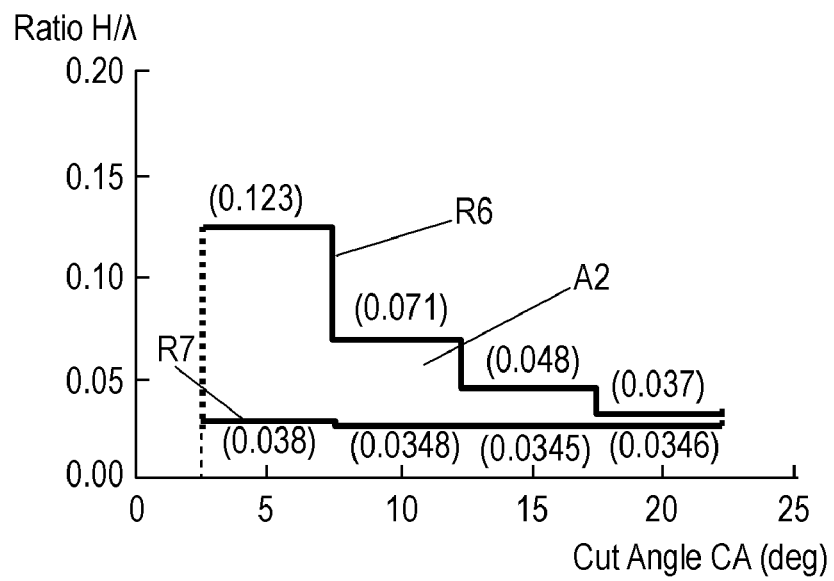
FIG. 11 shows a film thickness of a dielectric layer of another acoustic wave device according to Embodiment 2.
Figure 12:
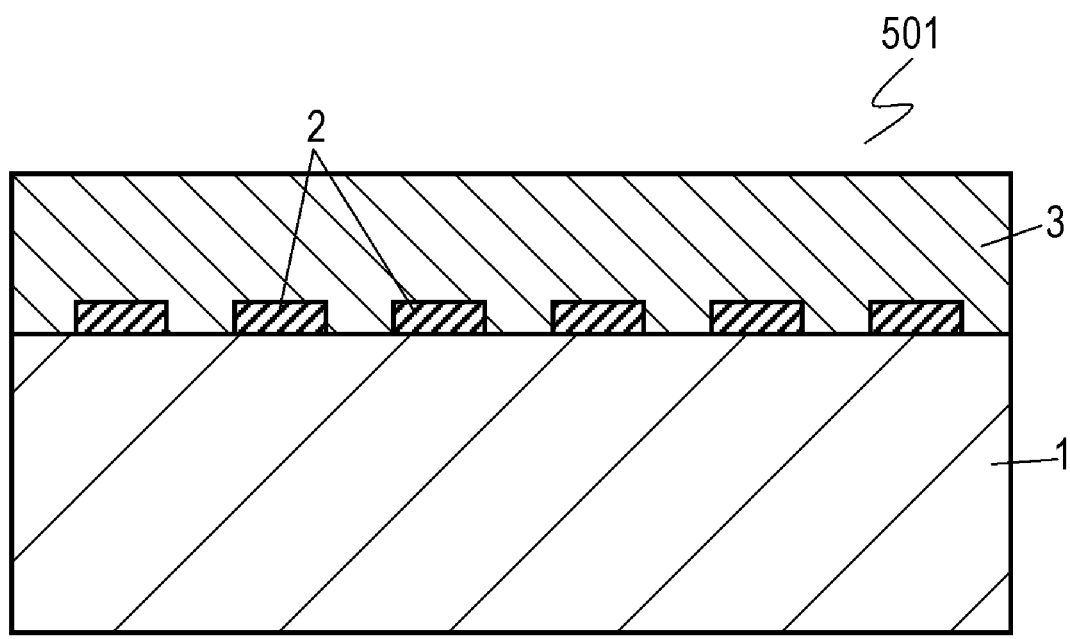
FIG. 12 is a sectional view of a conventional acoustic wave device.

FIG. 11 shows the minimum values Rmin2 of ratio H/λ corresponding to cut angles CA of a rotated Y-cut substrate used as piezoelectric substrates 11 of the samples of example 3 of another acoustic wave device according to Embodiment 2. In Example 3 of the acoustic wave device, ratio H/λ of film thickness H of dielectric layer 13 to the wavelength λ is within an area meeting both the area of Example 1 shown in FIG. 8 and the area of Example 2 shown in FIG. 10 That is, in the case that piezoelectric substrate 11 is made of a rotated Y-cut plate having cut angle CA is not smaller than 2.5 degrees and is smaller than 7.5 degrees, the ratio H/λ ranges from 0.038 to 0.123. In the case that the cut angle CA is not smaller than 7.5 degrees and is smaller than 12.5 degrees, the ratio H/λ ranges from 0.0344 to 0.071. In the case that the cut angle CA is not smaller than 12.5 degrees and is smaller than 17.5 degrees, the ratio H/λ is not smaller than 0.0345 to 0.048. In the case that the cut angle CA is not smaller than 17.5 degrees and is smaller than 22.5 degrees, the ratio H/λ is not smaller than 0.0346 to 0.037.

Example 3 of the acoustic wave device according to Embodiment 2 has the electromechanical coupling coefficient k2 for the Rayleigh wave smaller than the electromechanical coupling coefficient k2 for the device with quartz crystal, hence suppressing Rayleigh wave. Further, this acoustic wave device has a large electromechanical coupling coefficient for a main acoustic wave, accordingly suppresses spurious have a wide pass-bandwidth, and therefore, is useful for various telecommunication devices, such as mobile phones.

What is claimed is:
1. An acoustic wave device comprising:
a piezoelectric substrate made of lithium niobate and having a surface adapted to allow a leaky surface wave to propagate thereon;

an interdigital electrode made of aluminum and provided on a portion of the surface of the piezoelectric substrate; and a dielectric layer made of tantalum pentoxide provided on the surface of the piezoelectric substrate to cover the interdigital electrode, wherein the piezoelectric substrate is made of a rotated Y-cut substrate having a cut angle which is not smaller than 2.5 degrees and is not larger than 22.5 degrees, and a ratio $H/\lambda$ of a film thickness H of the dielectric layer to a wavelength $\lambda$ of a center frequency of the leaky surface wave ranges from 0.034 to 0.126.

2. The acoustic wave device according to claim 1, wherein the cut angle is not smaller than 2.5 degrees and is smaller than 7.5 degrees.

3. The acoustic wave device according to claim 1, wherein the cut angle is not smaller than 7.5 degrees and is smaller than 12.5 degrees, and the ratio $H/\lambda$ ranges from 0.0344 to 0.126.

4. The acoustic wave device according to claim 1, wherein the cut angle is not smaller than 12.5 degrees and is smaller than 17.5 degrees, and the ratio $H/\lambda$ ranges from 0.0345 to 0.122.

5. The acoustic wave device according to claim 1, wherein the cut angle is not smaller than 17.5 degrees and is smaller than 22.5 degrees, and the ratio $H/\lambda$ ranges from 0.0346 to 0.118.

6. The acoustic wave device according to claim 1, wherein the ratio $H/\lambda$ ranges from 0.0344 to 0.123.

7. The acoustic wave device according to claim 6, wherein the cut angle is not smaller than 2.5 degrees and is smaller than 7.5 degrees, and the ratio $H/\lambda$ ranges from 0.038 to 0.123.

8. The acoustic wave device according to claim 6, wherein the cut angle is not smaller than 7.5 degrees and is smaller than 12.5 degrees, and the ratio $H/\lambda$ ranges from 0.0344 to 0.071.

9. The acoustic wave device according to claim 6, wherein the cut angle is not smaller 12.5 degrees and is smaller than 17.5 degrees, and the ratio $H/\lambda$ ranges from 0.0345 to 0.048.

10. The acoustic wave device according to claim 6, wherein the cut angle is not smaller than 17.5 degrees and is smaller than 22.5 degrees, and the ratio $H/\lambda$ ranges from 0.0346 to 0.037.

11. The acoustic wave device according to claim 1, wherein the ratio $H/\lambda$ ranges from 0.034 to 0.126 with a phase velocity of the leaky surface wave being less than a phase velocity of a slow transverse wave which propagates on the surface of the substrate.

* * * * *